United States Patent [19]

Ki-Joon

[11] Patent Number: 5,068,516
[45] Date of Patent: Nov. 26, 1991

[54] DEVICE FOR LIQUID-PHASE THIN FILM EPITAXY

[75] Inventor: Kim Ki-Joon, Seoul, Rep. of Korea

[73] Assignee: SamSung Electronics Co., Ltd., Kyung Ki-Do, Rep. of Korea

[21] Appl. No.: 509,300

[22] Filed: Apr. 16, 1990

Related U.S. Application Data

[62] Division of Ser. No. 157,981, Feb. 19, 1988, Pat. No. 4,918,029.

[30] Foreign Application Priority Data

Feb. 21, 1987 [KR] Rep. of Korea ............... 1489/1987

[51] Int. Cl.$^5$ .................. H05B 3/64; H05B 6/10
[52] U.S. Cl. .................. 219/388; 219/396; 219/10.47; 219/10.71; 118/723; 118/725; 118/729
[58] Field of Search ............ 219/388, 390, 395, 396, 219/397, 398, 10.491, 10.67, 10.71, 10.47, 10.57, 10.43; 118/725, 727, 729, 723

[56] References Cited

U.S. PATENT DOCUMENTS

| 3,031,338 | 4/1962 | Bourdeau | 118/725 |
| 3,385,921 | 5/1968 | Hampton | 219/390 |
| 3,521,018 | 7/1970 | Boerger et al. | 118/725 |
| 4,348,580 | 9/1982 | Drexel | 118/725 |
| 4,416,623 | 11/1983 | Takahashi | 219/390 |
| 4,449,037 | 5/1984 | Shibamata et al. | 219/388 |
| 4,711,989 | 12/1987 | Yu | 219/390 |
| 4,760,244 | 7/1988 | Hokynar | 118/725 |

FOREIGN PATENT DOCUMENTS

| 0083933 | 7/1981 | Japan | 437/119 |
| 0136515 | 6/1984 | Japan | 437/119 |
| 0164122 | 6/1987 | Japan | 437/119 |

*Primary Examiner*—Philip H. Leung
*Attorney, Agent, or Firm*—Robert E. Bushnell

[57] ABSTRACT

A device enabling liquid-phase thin film epitaxial growth is disclosed wherein yield and quality of semiconductors in the fabrication sequences are improved. The device comprises an electric furnace which is disposed outside a quartz tube, a plurality of boats which are disposed within the quartz tube in accordance with a sort of melting liquids and a plurality of auxiliary heating devices are disposed around the boats with a power source independent from the electric furnace. According to this fabriction sequence after heating the inner part of the quartz tube up to a first temperature level by supplying the power source to the electric furnace, the melting liquids are firstly melted down enough by means of selectively heating the auxiliary heating devices up to a second temperature level higher than the first temperature level, the substrates are then moved to be in contact with the melting liquids and an epitaxial growth layer is consequently formed through selectively reducing the temperature of the auxiliary heating devices to other levels different from the first and second level.

2 Claims, 3 Drawing Sheets

DEVICE FOR LIQUID-PHASE THIN FILM EPITAXY

BACKGROUND OF THE INVENTION

This application makes reference to 35 U.S.C. 120 for the benefits therein provided and is a divisional of applicant's application earlier filed on Feb. 19, 1988 and assigned Ser. No. 07/157,981, which issued as U.S. Pat. No. 4,918,029 which issued on Apr. 17, 1990.

The present invention relates to a device and a method for growing a semiconductor thin film by means of liquid-phase epitaxial growth on a semiconductor substrate, and more particularly to a device and a method for thin film epitaxial growth which enables a multi-layer thin film epitaxy on a substrate.

Liquid phase epitaxy has taken importance as a manufacturing method for multi-layer thin film epitaxial layers of compound semiconductors such as Callium Phosphide, CaP, Callium Arsenide, CaAs, Indium Phosphide, InP, etc, for which slide processing has been widely used in the field. FIG. 1 A shows schematically a cross-sectional diagram of an epitaxial growth system making use of the slide processing method as a typical example of liquid-phase epitaxy of prior art, and FIG. 1B shows the temperature distribution within an electric furnace.

Hereinafter, the liquid-phase epitaxy of prior art will be briefly described with its basic configuration, referring to an embodiment of Callium Arsenide (GaAs). A boat shown in the FIG. 1A includes a movable substrate holder 3 which maintains 5 and 6, a first melting liquid holder 7, a second melting liquid holder 8 on the substrate holder and a supporting plate 4 for the melting liquid holders. In case of growing a thin film gallium arsenide mixed compounds on the gallium arsenide substrate 5, metal substances and impurities are added in the melting liquid holders 7 and 8 in order to attain a thin-film epitaxial layer having a mixed crystal ratio, a conductivity type and an electric charge density which are prescribed. Then, in considering a configuration of growing P-type gallium aluminum arsenide CaAlAs on a P-type CaAs substrate for use in a light emitting diode (LED) and also growing N-type CaAs on the P-type CaAlAs, gallium (Ga) is used as a primary solvent material to which CaAs, Al and zinc (Zn) are added in a first melting liquid 9, and CaAs and tellurium (Te) are added in a second melting liquid 10. In the initial stage, the boat in which the substrate 5 rests is out of contact with the Ca melting liquid 9 and 10 and is inserted into a quartz tube 2 filled with the hydrogen ambient. The electric furnace 1 is driven to heat so that the temperature within the epitaxy system is invariably kept up in a range of 750° C. to 900° C. independent of any alteration of positions within the system, as illustrated in the temperature distribution diagram of FIG. 1B. By this heating the metal substances and impurities added to the Ca melting liquid 9 and 10 get melted enough. After enough melting of the metal substances and the impurities, the substrate holder 3 is slid out and the first melting liquid 9 comes to be in contact with the substrate 5. Then, as the temperature goes down slowly, a first-layer CaAlAs, thin-film epitaxial growth is made. The substrate holder is again slid out and the second melting liquid 10 comes to be in contact with the substrate 5. By continuously decreasing the temperature, a second CaAs layer is grown in epitaxy. The stop of epitaxial growth can be made through sliding out the substrate holder 3 and mechanically removing the melting liquid 10 out of the substrate 5. The feature in the slide processing is to make thin-film epitaxial layers of different quality grow in sequence by using a plurality of melting liquids. However, in case that the first substrate 5 and the second substrate 6 are set in the holder 3 and the epitaxial growth of the two substrates is continuously made with said liquid-phase epitaxy, the temperature of the epitaxy system must be decreased during growth in the thin-film epitaxy by having the first substrate 5 be in contact with the first melting liquid 9. After the epitaxial growth of a first layer finishes, the first substrate 5 gets in tough with the second melting liquid 10 by means of sliding out the substrate holder and, at the same time, the second substrate 6 touches the first melting liquid 9. Because the second substrate 6 becomes to be in contact with the first melting liquid 9 under the environment of a temperature different from the temperature in the first layer epitaxy of the first substrate, a thin-film of very different quality from the first layer in the first substrate is formed in a first layer of second substrate. Accordingly, the continuous epitaxial growths cannot be made in the equal condition and on a plurality of substrates by means of the prior liquid-phase epitaxy. This fact makes low the yields of chips and also raises much waste of raw material such as galliums. In addition to that, when ambient temperature is up to the growing temperature and is continuously kept up so that the material in the molten gallium is made into a saturated enough solution, the surfaces of the substrates are exposed to the hydrogen ambient of high temperature. By this reason, a heat dissolution reaction arises on the surface of the substrates and thereby it frequently results in an arsenic vacancy defect at the surface of the substrates.

SUMMARY OF THE INVENTION

It is therefore an object of the present invention to provide an improved device and method for liquid-phase epitaxy. It is another object to provide a device and method for a liquid-phase epitaxial growth of sliding type which enables the epitaxial growth of a plurality of substrates in an equal condition.

To achieve these and other objects of the invention, the liquid-phase epitaxial growing device comprises a auxiliary heating device installed in each melting liquid holder, by means of which the liquid-phase epitaxy is carried out.

BRIEF DESCRIPTION OF THE DRAWINGS

The invention will be better understood with a reference to drawings, in which.

DETAILED DESCRIPTION OF THE INVENTION

Figure 1A:
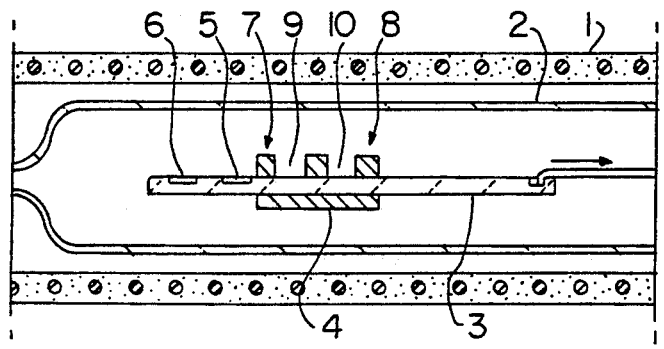
FIG. 1A is a schematic cross-sectional diagram of a device for a prior liquid-phase thin-film epitaxial growth of sliding type.
Figure 1B:
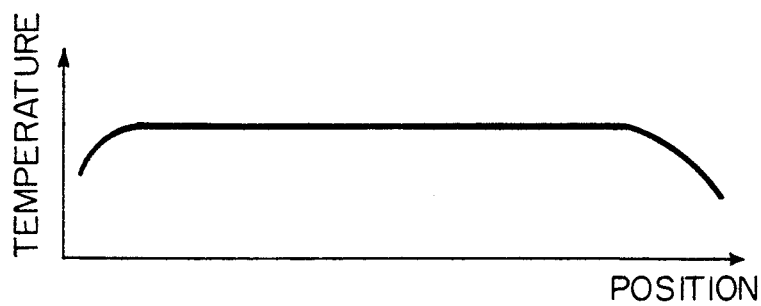
FIG. 1B is a temperature distribution diagram in an electric furnace.
Figure 2:
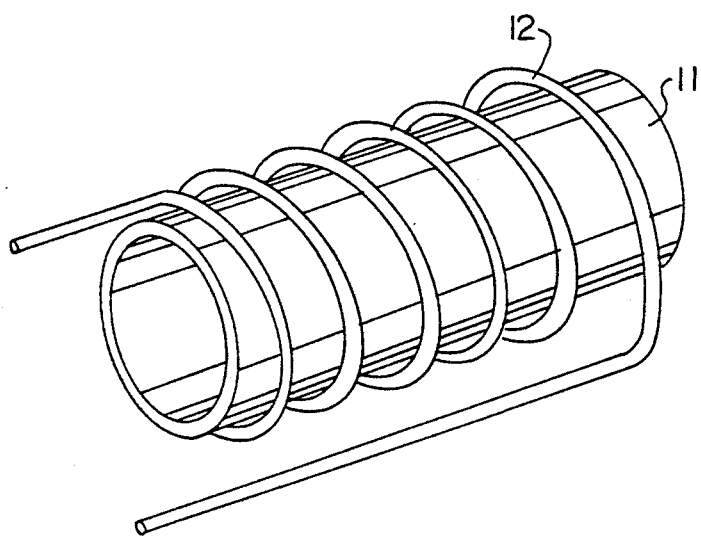
FIG. 2 is a schematic structural diagram of an auxiliary heating device showing a preferred embodiment in accordance with the invention.

Hereinafter, the invention will be described in detail with reference to the drawings. Referring to FIG. 2, showing a preferred embodiment of an auxiliary heating device to be installed in each melting liquid holder according to the invention, a quartz tube 11 is surrounded with a tungstenic heating coil 12. the auxiliary heating device is used to selectively heat and cool only a designated melting liquid in the liquid-phase epitaxy. FIG. 3A, 3C, 3E and 3G show each successive fabrication stage in the liquid-phase epitaxy and the device for use in the liquid-phase epitaxy according to the invention, comprising a plurality of auxiliary heaters, and FIGS. 3B, 3D, 3F and 3H represent the temperature distribution in the reaction tube according to the method of the invention.

The liquid-phase epitaxial growing device of the invention comprises a substrate holder 23 which maintains semiconductor substrates 25 and 26 and is movable, a first melting liquid holder 27 on the substrate holder 23, a second melting liquid holder 28 on the same substrate holder, supporting plates 24 for separately supporting each melting liquid holder, a plurality of boats installed with auxiliary heating devices 31 and 32 which are adapted to respectively control the temperatures of a first melting liquid 29 and a second melting liquid 30, and a main heating furnace 21 for controlling the temperature of a quartz tube 22 and all the epitaxy system. To attain the best effect of the auxiliary heating device, each auxiliary heating device should be disposed at sufficient distance to not influence each other in heating. For inserting and moving the auxiliary heating devices and the boats into the quartz tube, a supporting plate is used, which is not shown in the figure, having identical material to the quartz tube and supporting both the auxiliary heating devices and the boats.

Figure 3A:
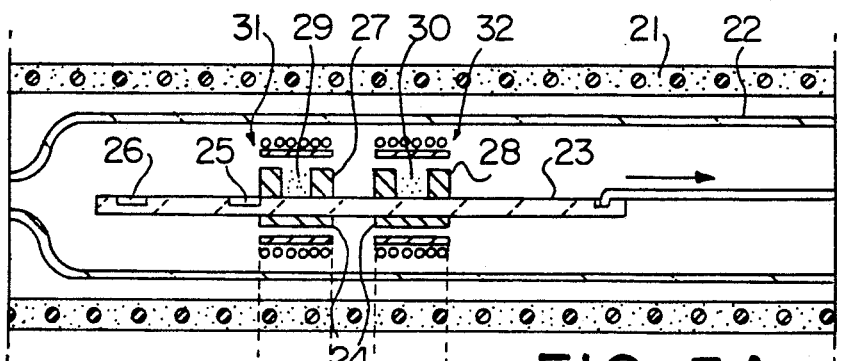
FIG. 3A to 3H show successive fabrication sequences in a liquid-phase thin-film epitaxy using a preferred embodiment in accordance with the invention and the temperature distributions therein.
Figure 3B:
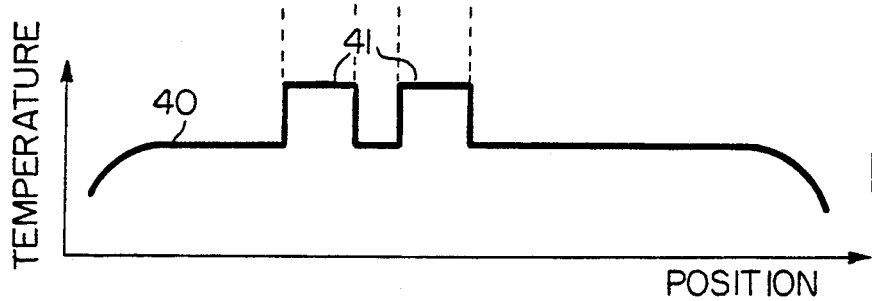

Now, it will be described in detail a preferred embodiment in which P-type CaAlAs is grown in epitaxy on a P-type CaAs substrate, that is the light emitting diode, and then N-type is grown in epitaxy on the above epitaxial growth. The melting liquid chiefly consists of gallium Ca as a main solvent material, to which CaAs, Al and Zn are added in the first melting liquid 29 and CaAs and tellurium are added in the second melting liquid 30. FIG. 3A shows a fabrication stage for heating both the first melting liquid and the second melting liquid enough to melt down the impurities and metal materials added into the liquids. First, the boats and the auxiliary heating devices are inserted into the hydrogen ambient quartz tube 22 and then the temperature of main heating furnace 21 is kept by heating to a within a high temperature range 40 from 700° C. to 800° C. in order to make the reaction tube have a temperature distribution such as is shown FIG. 3B. Also, by heating up the first auxiliary heater 31 and the second auxiliary heater 32, impurities in the melting liquids are made to be sufficiently melted in a high temperature range 41 from 750° C. to 900° C. The difference between the furnace 21 and the auxiliary heating devices 31 and 32 influences quality and thickness of a single crystal material to make the epitaxial growth. Because the epitaxy system has been already heated up by the electric furnace 21, only a small supply of electric power to the auxiliary heating devices is needed to attain sufficient difference.

Figure 3C:
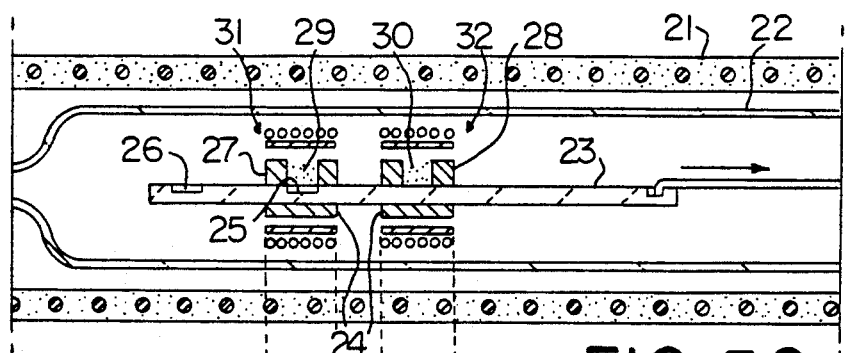
Figure 3D:
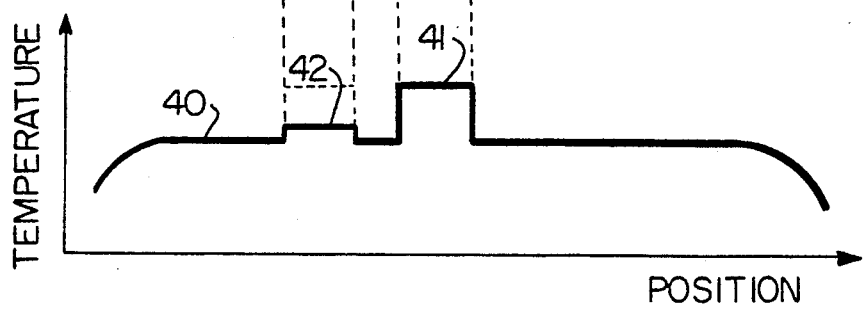

Referring to FIG. 3C, showing a fabrication stage in which the epitaxial growth of a first-layer CaAlAs single crystal is carried out on the substrate 25, the same substrate is placed to be in contact with the first melting liquid 27 by sliding the substrate holder 23, and during decreasing of the temperature of the first auxiliary heating device 31 the first-layer CaAlAs single crystal is made in epitaxy on the CaAs substrate 25. At his time, the first auxiliary heating device 31 is kept in a lower temperature level 42 than the level of 750° C. to 900° C., where its cooling speed depends upon the thickness of a CaAlAs single crystal layer which is intended in the epitaxy. On the other hand, the second auxiliary heating device 32 is still kept in the high temperature level 41 of 750° C. to 900° C. enough to melt down the impurities.

Figure 3E:
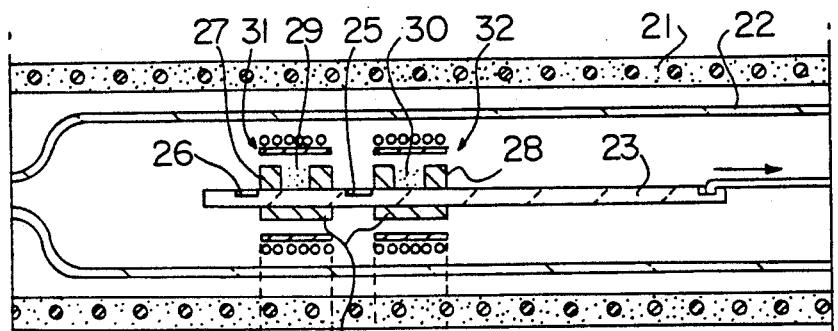
Figure 3F:
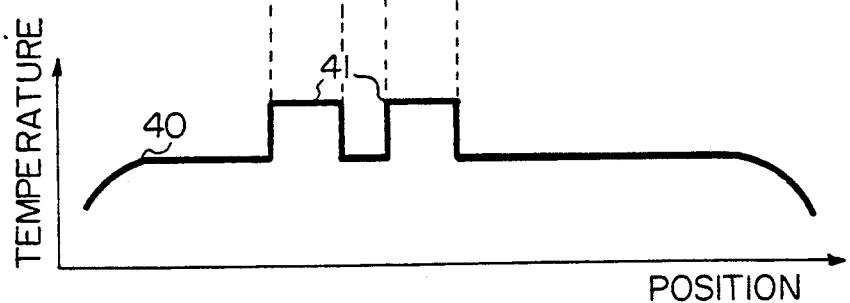
Figure 3G:
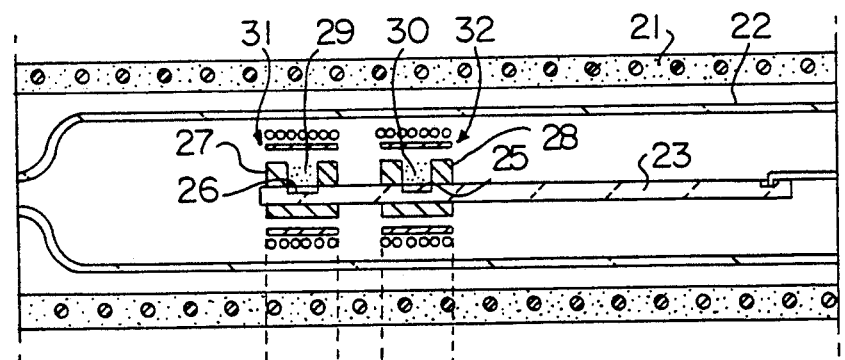
Figure 3H:
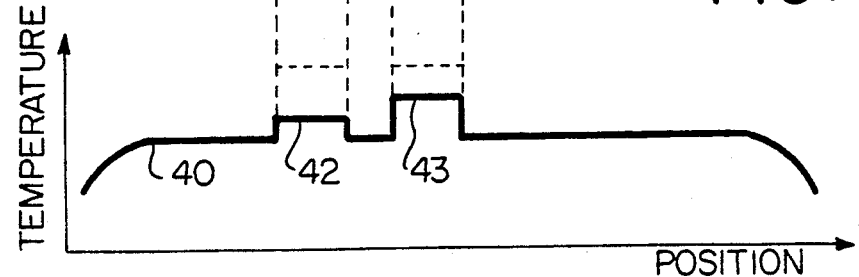

Referring to FIG. 3E, showing a fabrication stage which is a preliminary sequence prior to a second epitaxial growth after making the first-layer CaAlAs epitaxial growth on the substrate 25 with a designated thickness, the substrate holder 23 is slid out and the substrate 25 is separated from the first melting liquid 29. This makes the epitaxial growth stop and then the first auxiliary heating device 31 is heated up to reach the previous temperature level 41.

FIG. 3C shows a fabrication stage in which the second-layer CaAs epitaxial growth is carried out on the substrate surface of the first-layer CaAlAs epitaxy, and another CaAlAs epitaxial layer is grown on a new substrate 26 with the identical condition as the above-mentioned first-layer CaAlAs. Herein, by further sliding out the substrate holder 23, the first substrate 25 is disposed to be touch with the second melting liquid 30 and the second substrate 26 simultaneously is disposed to be in touch with the first melting liquid 29. After that, as the temperature of both the first and second auxiliary heating devices 31, 32 are respectively lowered to the levels that are required to form a CaAlAs layer and a CaAs layer each having intended thickness in epitaxy, a second-layer CaAs single crystal is grown in epitaxy on the first substrate 25, and in the same time a first-layer CaAlAs single crystal is grown in epitaxy on the second substrate 26. Once a specified thickness of epitaxial growth is formed, the melting liquids are isolated from the substrates through further sliding the substrate holder 23, by which the epitaxial growth stops. Through these fabrication sequences, the first layer CaAlAs epitaxial growth of the second substrate 26 becomes formable in the same condition as the first-layer epitaxy of the first substrate 25 and, after the second-layer CaAs epitaxial growth is carried out on the same first substrate 25 the epitaxy of the first substrate 25 is completed.

After heating up the auxiliary heating devices to the temperature of previous level 41, the substrate holder 23 is further slid out so that the second substrate 26 could be in touch with the second melting liquid 30. Then, through reducing the temperature of the second auxiliary heating device, the second-layer CaAs epitaxial growth is carried out to a specified thickness. After the growth, by furthermore sliding out the substrate holder, the second substrate 26 and the second melting liquid are totally separated, by which the epitaxy of the second substrate 26 ends.

While the invention has been particularly shown and described with reference to a single preferred embodiment, it will be understood by those skilled in the art that modifications in detail may be made without departing from the spirit and scope of the invention by means of changing the forms, arrangements and numbers of melting liquid holders and substrates, and also changing the form and material of auxiliary heating devices and the manipulating method.

As having described hereinbefore, the invention makes it possible to have each melting liquid being cooled in different cooling-speeds, and also have each melting liquid and substrate take a respective contacting interval by means of modifying positions of the substrates in designing the substrate holder, particularly in case that the first-layer epitaxial growing period differs from the second-layer epitaxial growing period. According, it becomes possible to carry out a liquid-phase epitaxial growth which consists of different thickness and quality through a single successive fabrication sequence, which eventually results in a better yield in production. Furthermore, an epitaxial growth layer of better quality may be attained by reducing a surface heat dissolution reaction in comparison with the prior art, because substrates waiting for growth epitaxy are kept at constant temperature and only the epitaxial growing portions are heated up to melting points.

What is claimed is:

1. A device for liquid-phase epitaxial growth comprising:
   a quartz tube;
   a plurality of boats in a movable substrate holder for supporting corresponding semiconductor substrates,
   a plurality of liquid holders and supporting plates for said liquid holders positioned within said quartz tube,
   an electric furnace positioned outside of said quartz tube, and
   a plurality of auxiliary heating devices disposed between said tube and said liquid holders and positioned around said liquid holders and boats, said auxiliary heating devices being connectable to power source independently from said electric furnace, whereby each liquid is enabled to be selectively heated or cooled by corresponding ones of said auxiliary heating devices independently of any other liquid within any corresponding other one of said plurality of liquid holders.

2. A device for liquid-phase epitaxial growth comprising:
   a quartz tube;
   a plurality of boats in a movable substrate holder for supporting semiconductor substrates,
   a plurality of melting liquid holders and supporting plates for said melting liquid holders positioned within said quartz tube,
   an electric furnace outside of said quartz tube, and
   a plurality of auxiliary heating devices disposed at a specified distance between said tube and said liquid holders and positioned around said melting liquid holders and boats, each said auxiliary heating device devices being connectable to power source independently from said electric furnace, whereby each melting liquid is enabled to be selectively heated or cooled.

* * * * *

UNITED STATES PATENT AND TRADEMARK OFFICE
CERTIFICATE OF CORRECTION

PATENT NO. : 5,068,516

DATED : 11/26/91

INVENTOR(S) : Ki-Joon KIM

It is certified that error appears in the above-identified patent and that said Letters Patent is hereby corrected as shown below:

ON THE TITLE PAGE:

Left Column, Line 2, replace "Ki-Joon" with --Kim--;
    Item [75], replace "Kim Ki-Joon" with --Ki-Joon Kim--.

IN THE ABSTRACT

Line 4, replace "comprises" with --uses--;
Line 7, replace "liquids" with --liquid--;
Line 13, replace "firstly" with --first--;
Line 16, replace "level the" with --level. The--.

Column 1
Line 57, insert a comma after "heating";
Line 58, replace "melted enough" with --sufficiently--;
Line 61, delete "to be";
Line 65, delete "to be";

Column 2
Line 14, replace "tough" with --touch--;
Line 17, replace "becomes to" with --comes--;
Line 18, delete "be"
Line 22, insert --the-- before "second";
Line 48, replace "a" with --an--.

Column 3
Line 54, delete "a" (first occurrence);

Column 4
Line 4, delete "to be";

UNITED STATES PATENT AND TRADEMARK OFFICE
CERTIFICATE OF CORRECTION

PATENT NO. : 5,068,516

DATED : 11/26/91

INVENTOR(S) : Ki-Joon Kim

It is certified that error appears in the above-identified patent and that said Letters Patent is hereby corrected as shown below:

Line 8, replace "his" with --this--;
Line 32, insert --in-- before "touch";

Column 5
Line 6, replace "hereinbefore" with --hereinabove--;
Line 11, delete "in" (second occurence)
Line 15, replace "Accordin" with --Accordingly--;

Column 6

Claim 2, Lines 28 and 29, delete "device"

Signed and Sealed this

Thirtieth Day of November, 1993

Attest:

BRUCE LEHMAN

Attesting Officer

Commissioner of Patents and Trademarks